(12) United States Patent
Ikenaga et al.

(10) Patent No.: US 7,064,011 B2
(45) Date of Patent: Jun. 20, 2006

(54) SEMICONDUCTOR DEVICE FABRICATING APPARATUS AND SEMICONDUCTOR DEVICE FABRICATING METHOD

(75) Inventors: Chikao Ikenaga, Shinjuku-Ku (JP); You Shimazaki, Shinjuku-Ku (JP); Masachika Masuda, Shinjuku-Ku (JP); Kazuhito Hosokawa, Ibaraki (JP); Takuji Okeyui, Ibaraki (JP); Keisuke Yoshikawa, Ibaraki (JP); Kazuhiro Ikemura, Ibaraki (JP)

(73) Assignees: Dai Nippon Printing Co., Ltd., Tokyo (JP); Nitto Denko Corporation, Tokyo (JP)

( * ) Notice: Subject to any disclaimer, the term of this patent is extended or adjusted under 35 U.S.C. 154(b) by 11 days.

(21) Appl. No.: 10/781,947

(22) Filed: Feb. 20, 2004

(65) Prior Publication Data

US 2004/0164387 A1 Aug. 26, 2004

(30) Foreign Application Priority Data

Feb. 21, 2003 (JP) .............................. 2003-043680

(51) Int. Cl.
*H01L 21/44* (2006.01)
*H01L 21/50* (2006.01)

(52) U.S. Cl. ....................... 438/118; 438/671; 438/686; 438/666; 438/652; 438/113; 438/127; 438/460

(58) Field of Classification Search ................ 438/118, 438/671, 686, 666, 652, 113, 127, 126, 460
See application file for complete search history.

(56) References Cited

U.S. PATENT DOCUMENTS

| | | | | |
|---|---|---|---|---|
| 5,976,912 A | * | 11/1999 | Fukutomi et al. | 438/110 |
| 6,534,330 B1 | * | 3/2003 | Sakamoto et al. | 438/29 |
| 6,562,660 B1 | * | 5/2003 | Sakamoto et al. | 438/124 |
| 6,969,905 B1 | * | 11/2005 | Paulus | 257/666 |
| 2001/0015489 A1 | * | 8/2001 | Fujisawa et al. | 257/686 |
| 2002/0197771 A1 | * | 12/2002 | Dotta et al. | 438/114 |
| 2004/0253764 A1 | * | 12/2004 | Kang et al. | 438/112 |

FOREIGN PATENT DOCUMENTS

| | | | |
|---|---|---|---|
| JP | 09-252014 | * | 9/1997 |
| JP | 2001-210743 | * | 8/2001 |

* cited by examiner

*Primary Examiner*—Mary Wilczewski
*Assistant Examiner*—Seth Barnes
(74) *Attorney, Agent, or Firm*—Oliff & Berridge, PLC

(57) ABSTRACT

A semiconductor device fabricating method comprises a substrate forming step of forming a plurality of separate conductive pads 20 on an adhesive layer included in an adhesive sheet 50, and a semiconductor chip mounting step of bonding semiconductor chips to the adhesive sheet 50 with surfaces thereof not provided with any electrodes in contact with the adhesive sheet 50, and electrically connecting electrodes 11 formed on the semiconductor chips 10 and upper parts of the conductive pads 20 with wires 30. The semiconductor chips 10, the wires 30 and the conductive pads 20 are sealed in a sealing resin molding 40, and then the adhesive sheet 50 is separated from the sealing resin molding 40. Each of the conductive pads 20 has a reduced part 20b, and a jutting part 20a jutting out from the reduced part 20b. The conductive pads 20 having such construction can be firmly bonded to the sealing resin molding 40.

9 Claims, 7 Drawing Sheets

RELATED ART

FIG. 8

RELATED ART

SEMICONDUCTOR DEVICE FABRICATING APPARATUS AND SEMICONDUCTOR DEVICE FABRICATING METHOD

TECHNICAL FIELD

The present invention relates to the field of techniques relating to surface-mount semiconductor devices and, more specifically, to a semiconductor device fabricating method for a surface-mount semiconductor device, and a semiconductor device fabricating apparatus for carrying out the method.

BACKGROUND ART

A metal leadframe is one of the components of a semiconductor device. Leads of the leadframe must be arranged at finer pitches to provide a higher pin-count package. The strength of leads decreases when the width of the leads is reduced according to the reduction of lead pitches. Consequently, the leads are bent or deformed, causing short circuits. Therefore, the semiconductor device is packaged inevitably in a large package to arrange leads at proper pitches. Thus, a package containing a semiconductor device including a leadframe is large and thick. Accordingly, surface-mount semiconductor devices of leadless construction not subject to restrictions placed by the leadframe have been proposed in, for example, Patents 1 and 2.

Patent 1: JP-A 9-252014
Patent 2: JP-A 2001-210743

Figure 7:
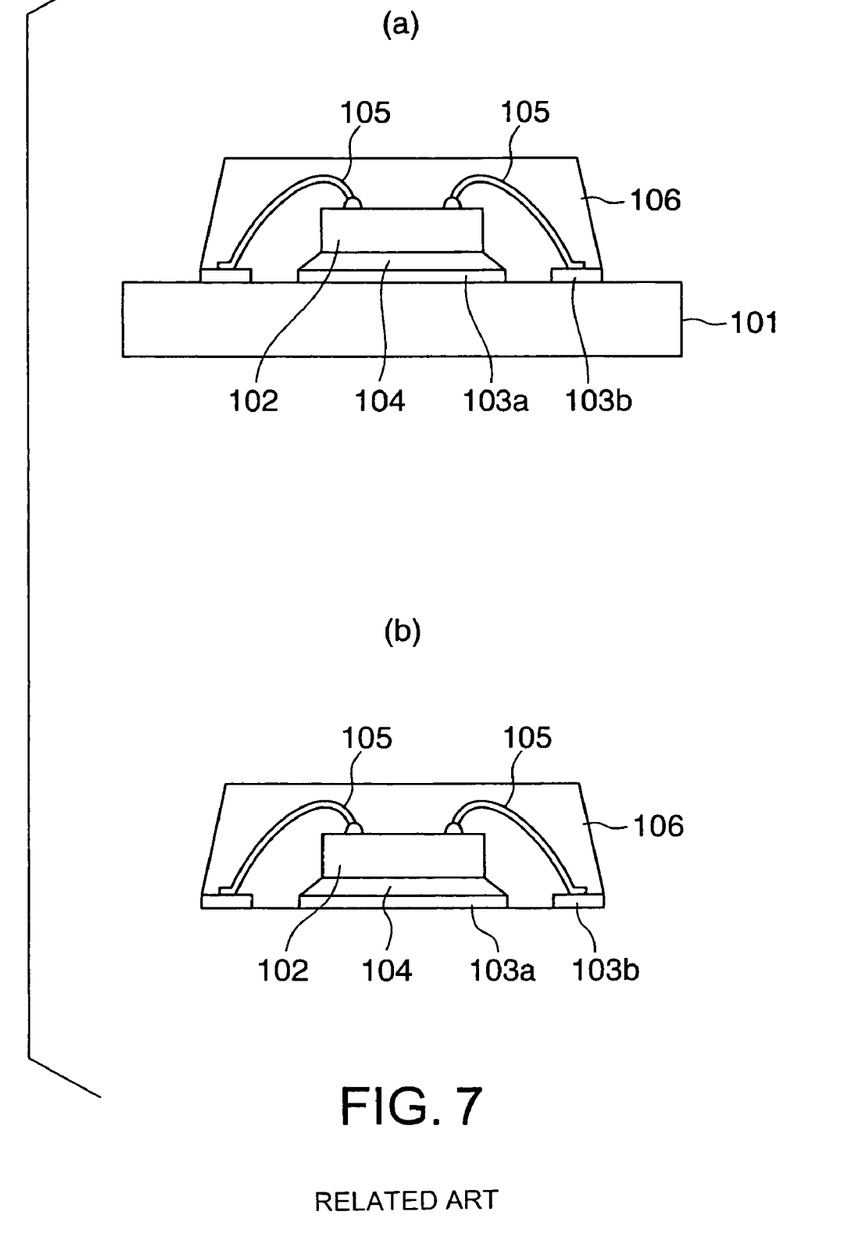
FIGS. 7(a) and 7(b) are views of assistance in explaining a conventional leadless semiconductor device.

FIGS. 7(a) and 7(b) show a semiconductor device mentioned in Patent 1. A method of fabricating this semiconductor device affixes a metal foil to a base 101, processes the metal foil by an etching process to leave predetermined parts of the metal foil, and bonds a semiconductor chip 102 to a part 103a, i.e., a die pad, of the metal foil with an adhesive layer 104. The method connects the semiconductor chip 102 electrically to parts 103b of the metal foil with wires 105, and packages the semiconductor chip 102, the metal foil and the wires 105 in a sealing resin molding 106 by transfer molding as shown in FIG. 7(a). The method separates the sealing resin molding 106 from the base 101 to complete a semiconductor device, i.e., a semiconductor IC package, as shown in FIG. 7(b). Since the semiconductor device fabricated by this method includes, in addition to the semiconductor chip 102, the adhesive layer 104 and the part 103a (die pad) of the metal foil, the problem is forming the semiconductor device in a small thickness.

The semiconductor device fabricating method mentioned in Patent 1 requires the metal foil to adhere closely to the base for an etching process for etching the metal foil and a molding process for sealing the semiconductor chip in the resin molding, and requires the metal foil and the sealing resin package to be easily separated from the base after the molding process. Thus, the base and the metal foil are required to have contradictory adhesive characteristics. Whereas the material bonding the metal foil to the base must be resistant to the etching action of the etching solution and the semiconductor chip must be held in place against pressure that acts thereon when the hot sealing resin flows into the mold during the molding process, the sealing resin package and the metal foil must be easily separated from the base. However, a base formed of Teflon® or a base formed of a metal and coated with silicone or Teflon® is utterly unable to have such an adhesive characteristic.

Figure 8:
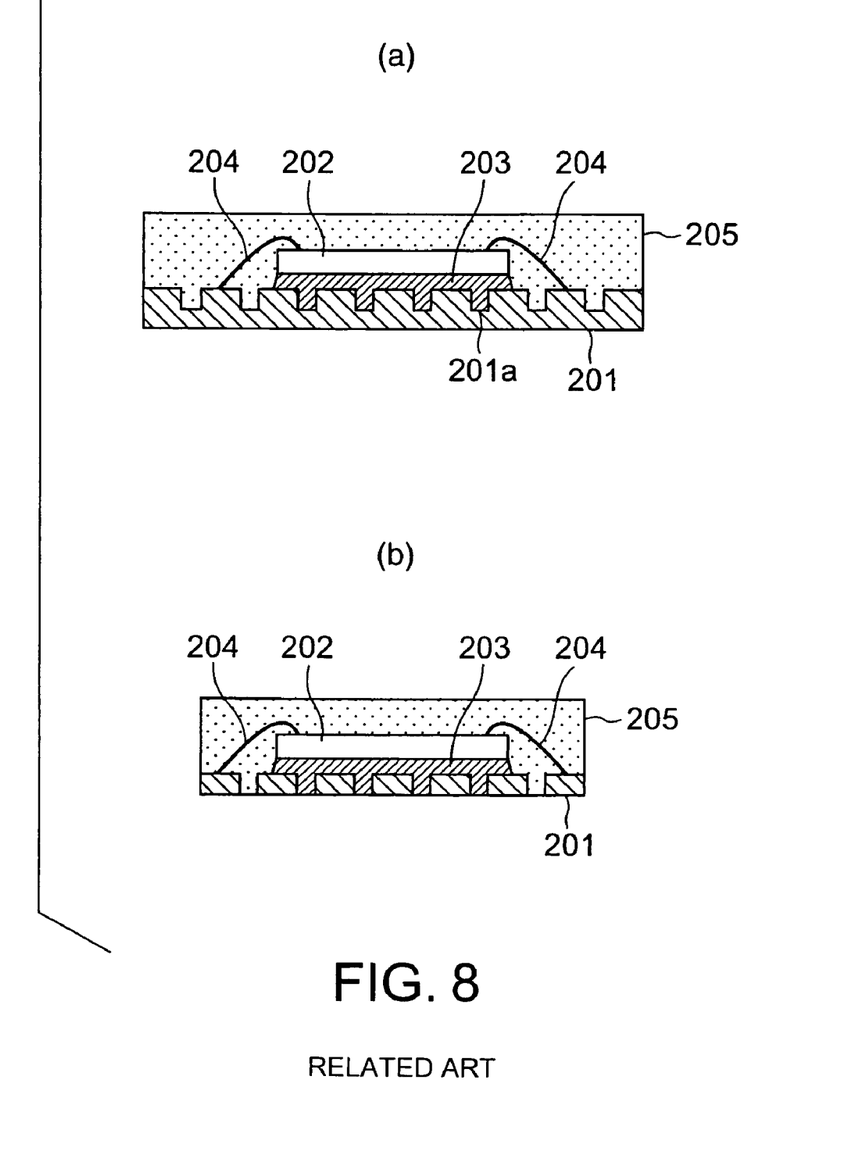
FIGS. 8(a) and 8(b) are views of assistance in explaining another conventional leadless semiconductor device.

FIGS. 8(a) and 8(b) show a semiconductor device mentioned in Patent 2. The following semiconductor device fabricating method is used to fabricate this semiconductor device. A metal plate 201 provided with grooves 201 formed in a grid is formed. A semiconductor chip 202 is bonded to the metal plate 201 with an adhesive layer 203. Wires 204 are extended by wire bonding between design parts. A sealing resin molding 205 is formed by transfer molding as shown in FIG. 8(a). Then, the metal plate 201 and the adhesive layer 203 are ground to shape the metal plate 201 and the sealing resin molding 205 in a design size to complete a semiconductor device as shown in FIG. 8(b). The semiconductor device fabricated by this semiconductor device fabricating method, however, includes the adhesive layer 203 and the metal plate 201 accompanying the semiconductor chip 202. Such construction of the semiconductor device is a drawback in providing thin semiconductor devices desired by the industry.

Thus, the conventional semiconductor device fabricating methods have difficulty in fabricating a thin semiconductor device. Therefore, the semiconductor chip needs to be formed in a small thickness by grinding to form a thin semiconductor device. Thin semiconductor chips are liable to be chipped or cracked in semiconductor device fabricating processes, and defective semiconductor chips increases the cost of semiconductor devices. Use of the adhesive needs additional processes and additional materials, which also increases the cost of semiconductor devices.

DISCLOSURE OF THE INVENTION

The present invention has been made in view of the foregoing problems and it is therefore an object of the present invention to provide a surface-mount semiconductor device of leadless construction having a small thickness, capable of being fabricated at a low cost and having high strength, and to provide a semiconductor device fabricating method of fabricating the surface-mount semiconductor device.

According to the present invention, a semiconductor device comprises: a semiconductor chip; a plurality of conductive pads connected to the semiconductor chip with wires; and a sealing resin molding sealing the semiconductor chip, the wires and the conductive parts therein; wherein the respective back surfaces of the semiconductor chip and the conductive pads are exposed, and each of the conductive pads has a reduced part of a small size and a jutting part jutting out from the reduced part.

In the semiconductor device according to the present invention, the jutting part of each conductive pad lies on the inner side of the reduced part in the sealing resin molding.

In the semiconductor device according to the present invention, each of the conductive pads has a reduced part of a small size, and a pair of jutting parts formed on the opposite sides, respectively, of the reduced part.

A semiconductor device fabricating method according to the present invention comprises the steps of: preparing an adhesive sheet having a base sheet and an adhesive layer; forming a plurality of conductive pads on the adhesive layer of the adhesive sheet; placing semiconductor chips on the adhesive layer of the adhesive sheet and connecting the conductive pads to the semiconductor chips with wires; sealing the semiconductor chips, the conductive pads and the wires in a sealing resin molding on the adhesive sheet; separating the adhesive sheet from the sealing resin molding; and cutting the sealing resin molding into packages respectively including the semiconductor chips; wherein the step of forming the conductive pads on the adhesive layer includes the steps of forming a plated nickel layer and a plated noble metal layer in layers at least on one of the surfaces of a metal foil, placing the metal foil provided with the plated nickel layer and the plated noble metal layer on the adhesive layer of the adhesive sheet, and etching the metal foil by using the plated nickel layer and the plated noble metal layer as a resist to form the conductive pads, each having a reduced part of the metal foil having a small size, and a jutting part of the plated nickel layer and the plated noble metal layer and jutting out from the reduced part.

In the semiconductor device fabricating method according to the present invention, in the step of forming the conductive pads, each conductive pads is formed so as to have a reduced part of the metal foil having a small size and a pair of jutting parts of the plated nickel layer and the plated noble metal layer and formed on the opposite sides of the reduced part, by forming the plated nickel layer and the plated noble metal layer in layers on each of both the surfaces of the metal foil to.

In the semiconductor device fabricating method according to the present invention, the step of forming the conductive pads further includes a step of shaping the adhesive sheet by press working after forming the conductive pads by etching the metal foil.

In the semiconductor device fabricating method according to the present invention, the metal foil is formed of copper or a copper alloy and has a thickness in the range of 0.01 to 0.1 mm.

In the semiconductor device fabricating method according to the present invention, the plated noble metal layer contains at least Au, Ag or Pd.

In the semiconductor device fabricating method according to the present invention, the base sheet of the adhesive sheet has an elastic coefficient of 1.0 GPa or above at 200° C., and the adhesive layer has an elastic coefficient of 0.1 MPa or above at 200° C.

In the semiconductor device fabricating method according to the present invention, the adhesive layer of the adhesive sheet is formed of a thermosetting adhesive, has an elastic coefficient of 0.1 MPa or below at temperatures in the range of 100° C. to 150° C. before hardening, and an elastic coefficient of 0.1 MPa or above at 200° C. after hardening.

In the semiconductor device fabricating method according to the present invention, the thermosetting adhesive contains, as essential components, an epoxy resin, an epoxy curing agent and an elastic material.

In the semiconductor device fabricating method according to the present invention, adhesive strength bonding the conductive pads and the adhesive layer of the adhesive sheet together is in the range of 0.1 to 15 N/20 mm.

BEST MODE FOR CARRYING OUT THE INVENTION

Preferred embodiments of the present invention will be described with reference to the accompanying drawings.

Figure 1:
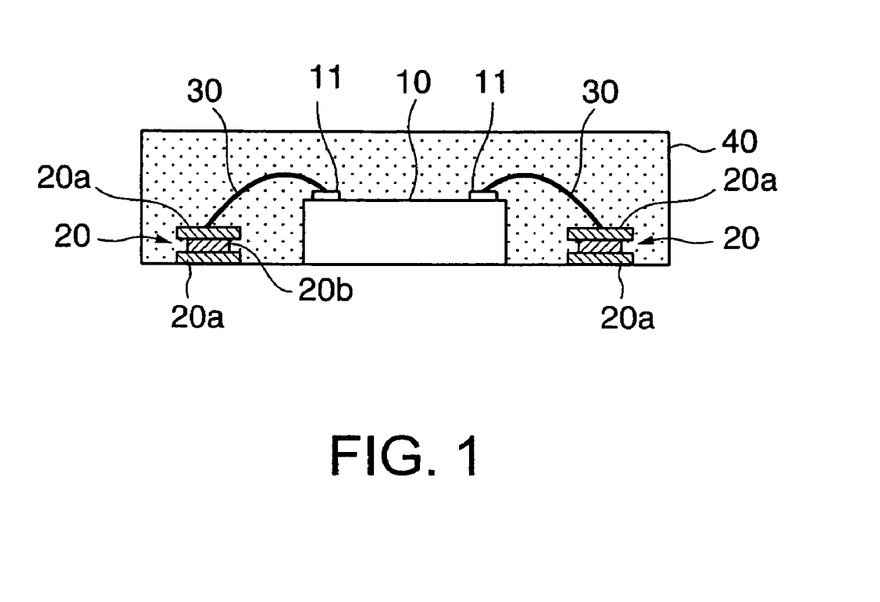
FIG. 1 is a schematic sectional view of a semiconductor device in a first embodiment according to the present invention.

Referring to FIG. 1 showing a semiconductor device in a first embodiment according to the present invention, the semiconductor device has a semiconductor chip 10, a plurality of conductive pads 20 connected to the semiconductor chip 10 with wires 30, and a sealing resin block (sealing resin molding) 40 sealing the semiconductor chip 10, the wires 30 and the conductive pads 20 therein. The semiconductor chip 10 is provided on its upper surface with electrodes 11 electrically connected to the upper surfaces of the conductive pads 20 with the wires 30. The semiconductor chip 10, the wires 30 and the conducive pads 20 are sealed in the sealing resin block 40 to protect the same from the external environment. The lower surface not provided with any electrodes 11 of the semiconductor chip 10, and the lower surfaces, not connected to the wires 30, of the conductive pads 20 are flash with the lower surface of the sealing resin block 40 and are exposed. Each of the conductive pads 20 has a reduced part 20b of a small size, and a pair of jutting parts 20a jutting out from the reduced part 20b and formed on the opposite sides, respectively, of the reduced part 20b. The upper jutting part 20a is on the inner side of the reduced part 20b in the sealing resin block 40. As mentioned above, the lower surface of the semiconductor chip 10 and those of the conductive pads 20 are exposed in the lower surface of the sealing resin block 40. The semiconductor device is of a leadless type not having any die pad and any adhesive layer for bonding a semiconductor chip to a die pad. The jutting parts 20a of the conductive pads 20 have an anchoring effect in the sealing resin block 40 to enhance bonding strength between the conductive pads 20 and the sealing resin block 40. The outer diameter of the reduced part 2b is substantially equal throughout the reduced part 2b from the upper jutting part 2a to the lower jutting part 2a. However, the outer diameter of the reduced part 2b may be a minimum on the side of the upper jutting part 2a, and gradually increased to the side of the lower jutting part 2a.

Figure 2:
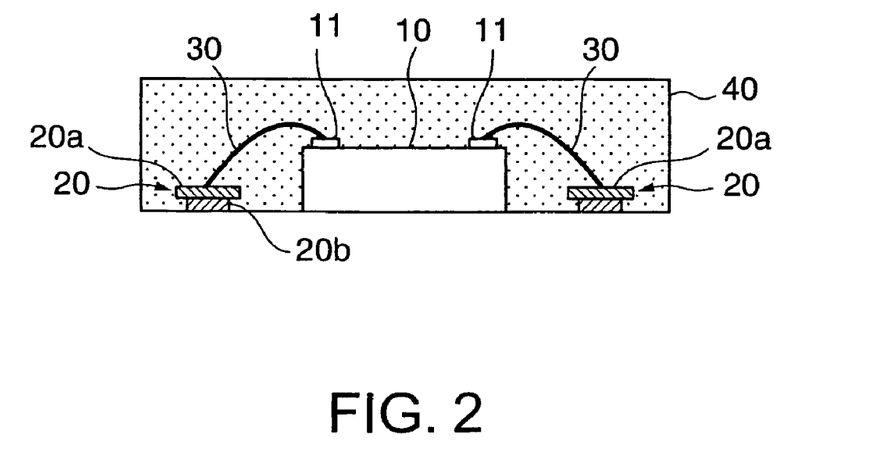
FIG. 2 is a schematic sectional view of a semiconductor device in a second embodiment according to the present invention.

A semiconductor device in a second embodiment according to the present invention shown in FIG. 2 is a leadless semiconductor device identical in construction with the semiconductor device in the first embodiment, except that the semiconductor device in the second embodiment is provided with conductive pads 20 each having a reduced part 20b and only a jutting part 20a formed on the upper surface of the reduced part 20b. The jutting parts 20a of the conductive pads 20 have an anchoring effect in a sealing resin block 40 to enhance bonding strength between the conductive pads 20 and the sealing resin block 40.

A conventional semiconductor device has a die pad of a thickness of between about 100 and about 200 μm and an adhesive layer of a thickness of between about 10 to about 50 μm for bonding a semiconductor chip to a die pad.

Therefore, the thickness of the semiconductor device according to the present invention not having any die pad and any adhesive layer is smaller than that of the conventional semiconductor device by 110 to 250 µm, provided that the respective thicknesses of the semiconductor chip and the sealing resin block covering the semiconductor chip are the same as those of the semiconductor chip and the sealing resin block of the conventional semiconductor device.

Figure 3:
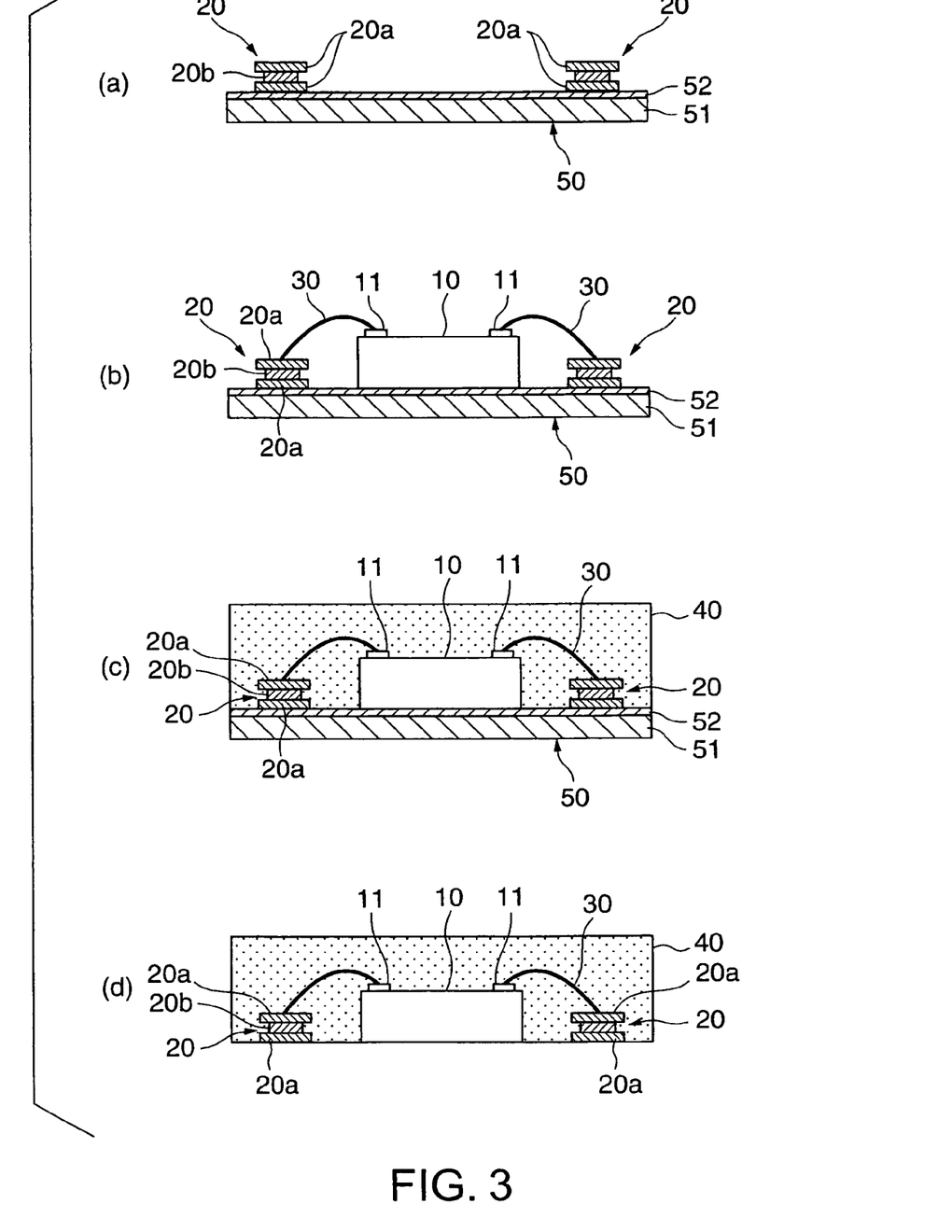
FIGS. 3(a) to 3(d) are views of assistance in explaining the steps of a semiconductor device fabricating method of fabricating the semiconductor device shown in FIG. 1.

FIGS. 3(*a*) to 3(*d*) are views of assistance in explaining the steps of a semiconductor device fabricating method of fabricating the semiconductor device shown in FIG. 1. The semiconductor device fabricating method will be described with reference to FIGS. 3(*a*) to 3(*d*).

Referring to FIG. 3(*a*), an adhesive sheet 50 having a base sheet 51 and an adhesive layer 52 is made. A plurality of separate conductive pads 20 are formed on the adhesive layer 52 of the adhesive sheet 50 to construct a substrate. Each of the conductive pads 20 has a reduced part 20*b*, and jutting parts 20*a* formed on the upper and the lower surface of the reduced part 20*b*. A process of forming the substrate provided with the conductive pads 20 will be described later.

Figure 4:
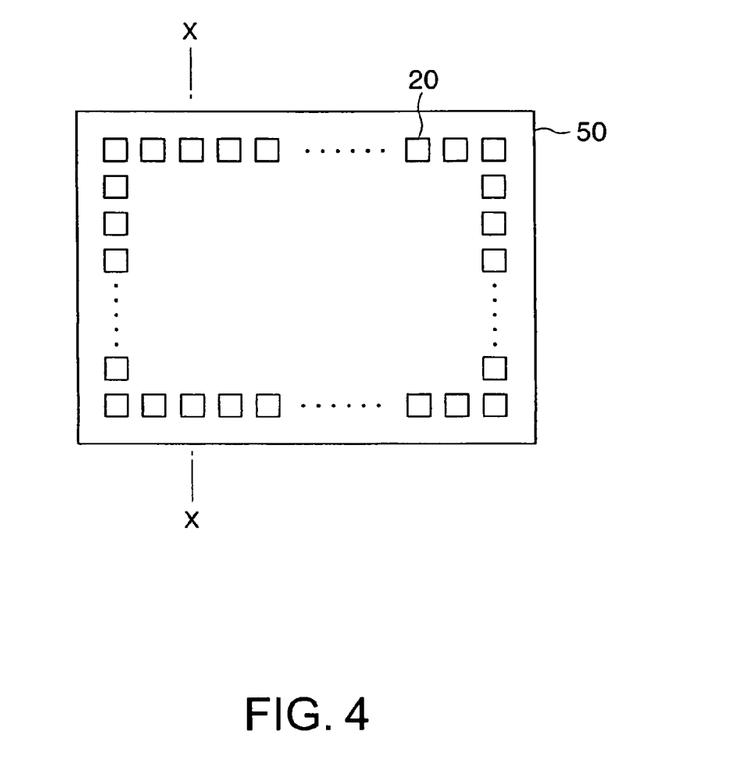
FIG. 4 is a typical plan view of an adhesive sheet after the completion of a conductive pad forming step shown in FIG. 3.

FIG. 4 is a typical plan view of the substrate formed by forming the conductive pads 20 on the adhesive sheet 50. The plurality of conductive pads 20 corresponds to the electrodes of the semiconductor chip 10, respectively. All the conductive pads 20 are electrically isolated from each other.

Then, as shown in FIG. 3(*b*), a semiconductor chip 10 provided with electrodes 11 is placed at a predetermined position on the adhesive sheet 50 with the lower surface thereof not provided with any electrodes in contact with the adhesive layer 52 to bond the semiconductor chip 10 to the adhesive sheet 50. Then, the plurality of conductive pads 20 are connected electrically to the electrodes 11 of the semiconductor chip 10 with wires 30, respectively. If the semiconductor chip 10 is small and there is difficulty in firmly bonding the semiconductor chip 10 to the adhesive sheet 50, the semiconductor chip 10 may be securely fastened to the adhesive sheet 50 with a commercially available bonding material, such as a silver paste or a die-attaching film. Since any die pad for supporting the semiconductor chip 10 is unnecessary, the thickness of the device shown in FIG. 3(*b*) is smaller than that of the corresponding structure of the conventional semiconductor device by 100 to 200 µm.

Then, as shown in FIG. 3(*c*), the semiconductor chip 10, the wires 30 and the conductive pads 20 are sealed in a sealing resin block 40 in a mold by transfer molding to complete a semiconductor device on the adhesive sheet 50. When necessary, the sealing resin block 40 is heated for postcuring. The sealing resin block 40 may be heated for postcuring either before or after the removal of the adhesive sheet 50. Subsequently, the adhesive sheet 50 is separated from the semiconductor chip 10 as shown in FIG. 3(*d*) to obtain the semiconductor device shown in FIG. 1.

A substrate forming procedure for forming the substrate by forming the separate conductive pads 20 on the adhesive layer 52 of the adhesive sheet 50 will be described with reference to FIGS. 5(*a*) to 5(*e*).

A metal foil 60 of copper or a copper alloy is used for forming the conductive pads 20. The thickness of the metal foil 60 having a necessary strength is in the range of 0.01 to 0.1 mm. Dry resist films 61 are applied to both the surfaces of the metal foil 60. The dry resist films 61 are patterned in a pattern complementary to that of the conductive pads 20 by photolithography as shown in FIG. 5(*a*).

Figure 5:
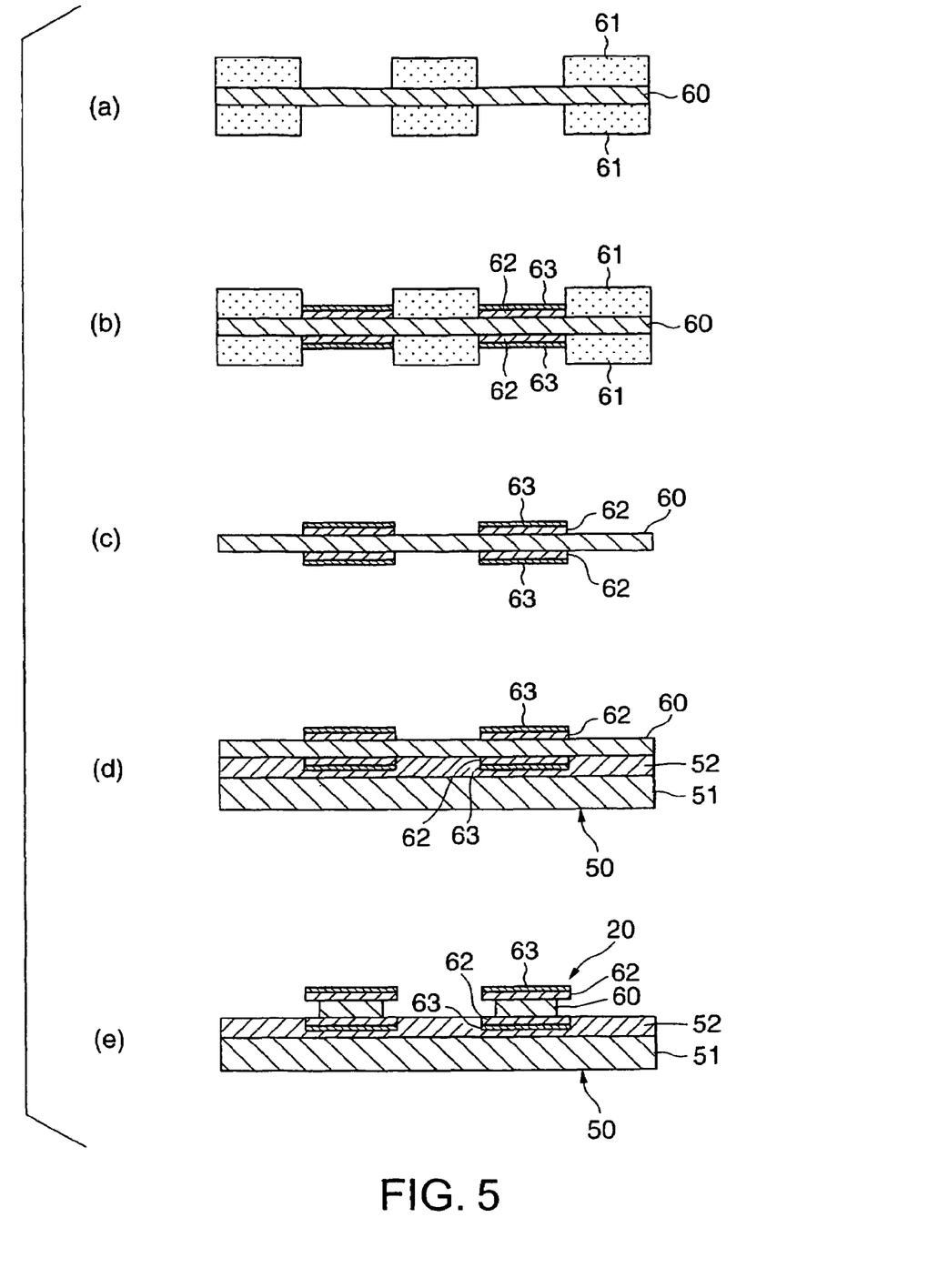
FIGS. 5(a) to 5(e) are views of assistance in explaining a base plate making procedure.

Then, as shown in FIG. 5(*b*), nickel layers 62 as copper-diffusion barrier layers, and noble metal layers 63 are formed by plating in the pattern of the conductive pads 20 using the patterned dry resist films 61 as masks on the metal foil 60. Then, as shown in FIG. 5(*c*), the dry resist films 61 are removed. The noble metal layers 63 contain at least Au, Ag or Pt Subsequently, as shown in FIG. 5(*d*), the metal foil 60 provided with the nickel layers 62 and the noble metal layers 63 is bonded to the adhesive layer 52 of the adhesive sheet 50. Then, as shown in FIG. 5(3), the metal foil 60 is etched using the noble metal layers 63 as masks to form the separate conductive pads 20. Side surfaces of lands formed by the metal foil 60 are etched to form the reduced parts 20*b*. Thus, the reduced parts 20*b* of the metal foil 60 and the jutting parts 20*a* each consisting of the nickel layer and the noble metal layer are formed.

Thus, the conductive pads 20 each having the reduced part 20*b* and the jutting parts 20*a* formed on the upper and the lower surface of the reduced part 20*b* are formed by the steps shown in FIGS. 5(*a*) to 5(*e*). In forming the conductive pads 20 each having the reduced part 20*b* and the jutting part 20*a* formed on the upper surface of the reduced part 20*b*, a nickel layer 62 as a diffusion barrier layer, and a noble metal layer 63 are formed on the upper surface of a metal foil 60. The metal foil 60 is bonded to the adhesive sheet 50 with the lower surface thereof in contact with the adhesive sheet 50, and the metal foil 60 is etched to form the separate conductive pads 20 each having the reduced part 20*b* and the jutting part 20*a* formed on the upper surface of the reduced part 20*b*.

Figure 6:
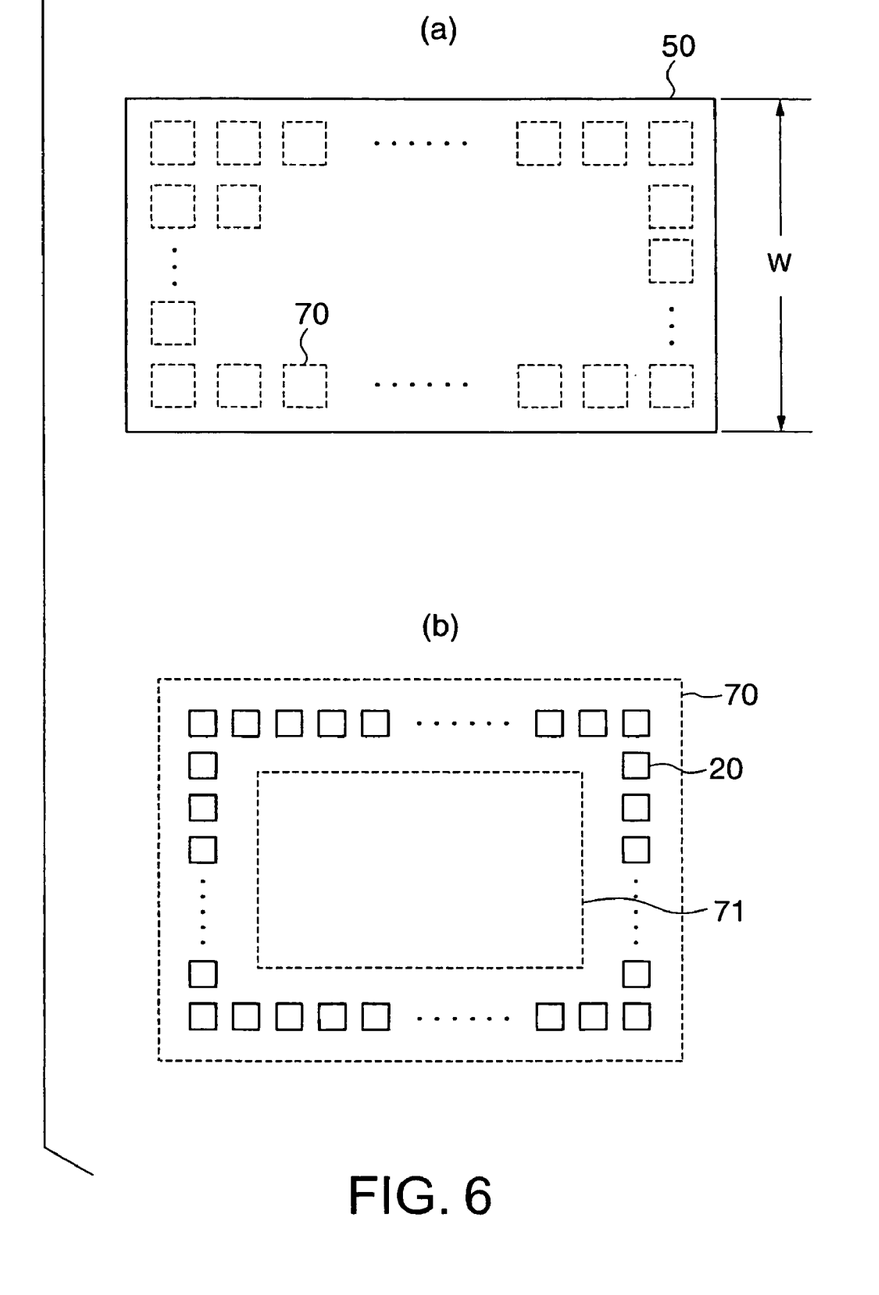
FIGS. 6(a) and 6(b) are top views of an adhesive sheet after conductive pads have been formed on the adhesive sheet by a base plate making step of the semiconductor device fabricating method according to the present invention.

Practically, the semiconductor device fabricating method fabricates a plurality of semiconductor devices simultaneously. The practical semiconductor device fabricating method will be described with reference to FIGS. 6(*a*) and 6(*b*). Referring to FIG. 6(*a*) showing an adhesive sheet 50 in a typical plan view, indicated at 70 are divisions each including a chip-mounting region 71 in which a semiconductor chip is placed, and surrounded by a peripheral region in which conductive pads 20 are formed. The divisions 70 are arranged in columns and rows. FIG. 6(*b*) shows one of the divisions 70 in an enlarged view. A necessary number of conductive pads 20 are arranged around the chip-mounting region 71.

Referring to FIG. 6(*a*), the adhesive sheet 50 has, for example, a width W of 500 mm. A plurality of divisions 70 are formed on an adhesive strip by predetermined steps to form a long substrate. The long substrate is wound in a roll. The substrate is cut to obtain a 500 mm wide adhesive sheet 50 of a predetermined length having a necessary number of divisions 70. A plurality of semiconductor chips are mounted on the cut adhesive sheet 50 by a semiconductor chip mounting step, and the adhesive sheet 50 holding the plurality of semiconductor chips is subjected to a sealing step to seal the plurality of semiconductor chips in a sealing resin block. The adhesive sheet 50 having the plurality of semiconductor chips sealed in the sealing resin block is cut by dicing or punching into a plurality of individual semiconductor devices.

It is preferable that the adhesive sheet 50 employed by the semiconductor device fabricating method of the present invention is capable of securely holding the semiconductor chips 10 and the conductive pads 20 until the sealing step is completed, and of being easily separated from the semiconductor devices. As mentioned above, the adhesive sheet 50 has a base sheet 51 and an adhesive layer 52. Although there is not any particular restriction on the thicknesses of the base sheet 51 and the adhesive layer 52, the thickness of the base sheet 51 is in the range of about 12 to about 200 µm, preferably, in the range of 50 to 150 μm, and the thickness of the adhesive layer 52 is in the range of about 1 to abut 50 μm, preferably, in the range of 5 to 20 μm.

Preferably, the base sheet 51 of the adhesive sheet 50 has an elastic coefficient of 1.0 GPa or above at 200° C., and the adhesive layer 52 of the base sheet 50 has an elastic coefficient of 0.1 MPa or above at 200° C.

In the chip-mounting process including wire bonding, the adhesive sheet 50 is exposed to a high temperature in the range of about 150° C. to about 200° C. Therefore, base sheet 51 and the adhesive layer 52 of the adhesive sheet 50 must have heat resistance capable of withstanding such a high temperature. From such a point of view, a sheet having an elastic coefficient of 1.0 GPa or above, preferably, 10 GPa or above, at 200° C. is used as the base sheet 51. Preferably, the base sheet 51 has an elastic coefficient in the range of about 1.0 to about 1000 GPa. Preferably, the adhesive layer 52 has an elastic coefficient of 0.1 MPa or above, preferably, 0.5 MPa or above, more preferably, 1 MPa or above. Preferably, the elastic coefficient of the adhesive layer 52 is in the range of about 0.1 to about 100 MPa. The adhesive layer 52 having such an elastic coefficient is not easily softened and fluidized and ensures stable wire bonding. The measurement of elastic coefficient will be explained in detail in connection with the description of examples.

The base sheet 51 of the adhesive sheet 50 may be formed of either an organic material or an inorganic material. In view of facilitating handling and preventing warping, it is preferable that the base sheet is a metal foil, such as a stainless steel foil, a Ni foil, an Al foil, a Cu foil or a copper alloy foil. A Cu foil or a copper alloy foil is preferable from the viewpoint of cost, availability and selectivity. Preferably, one of the surfaces of a metal foil serving as the base sheet 51 is processed by a surface-roughening process to ensure a sufficient adhesive strength between the base sheet 51 and the adhesive layer 52. The surface-roughening process may be either a physical roughening process, such as sandblasting process, or a chemical roughening process, such as an etching process.

Preferably, the adhesive layer 52 of the adhesive sheet 50 is formed of a thermosetting adhesive containing, as principal components, an epoxy resin, an epoxy-curing agent and an elastic material. The thermosetting adhesive enables bonding in an uncured state, namely, a state of B-stage, at a comparative low temperature of 150° C. or below, and the elastic coefficient and heat resistance of the thermosetting adhesive can be enhanced by postcuring after bonding.

Suitable epoxy resins are glycidylamine epoxy resins, bisphenol F epoxy resins, phenolic novolak epoxy resins, cresol novolac epoxy resins, biphenyl epoxy resins, naphthalene epoxy resins, aliphatic epoxy resins, alicyclic epoxy resins, heterocyclic epoxy resins, spiro-ring-containing epoxy resins, and halogenated epoxy resins. These epoxy resins may be individually used or may be used in a mixture of some of these epoxy resins. Suitable epoxy-curing agents are imidazole compounds, derivatives of imidazole compounds, derivatives of imidazole compounds, amine compounds, dicyandiamide, hydrazone compounds and phenolic resins. These epoxy-curing agents may be individually used or may be used in a mixture of some of these epoxy-curing agents. Suitable elastic materials are acrylic resins, acrylonitrile-butadiene copolymers, phenoxy resins and polyamide resins. These elastic materials may be individually used or may be used in a mixture of some of these elastic materials.

Preferably, adhesive strength bonding the conductive pads 20 and the adhesive layer 52 together is in the range of 0.1 to 15 N/20 mm, more preferably, in the range of 0.3 to 15 N/20 mm. The adhesive strength bonding the conductive pads 20 and the adhesive layer 52 together may be selected in the foregoing range of adhesive strength according to the size of the conductive pads 20. It is preferable that the adhesive strength is comparatively low when the conductive pads 20 are large, and the adhesive strength is comparatively high when the conductive pads 20 are small. The adhesive sheet 50 has a proper adhesive property and hence the conductive pads 20 adhesively bonded to the adhesive layer 52 are hardly dislocated in the substrate making step and the semiconductor chip mounting step. The adhesive sheet 50 can be separated from the sealing resin block 40 without difficulty in the adhesive sheet separating step, and hence the semiconductor device is damaged scarcely. The measurement of adhesive strength will be explained in detail in connection with the description of examples.

The adhesive sheet 50 may have an antistatic property when necessary. The adhesive sheet 50 can be made antistatic by adding a conductive filler in the base sheet 51 and the adhesive layer 52. An antistatic agent may be applied to the surface of the base sheet 51 contiguous with the adhesive layer 52 or to the back surface of the base sheet 51. The antistatic property of the adhesive sheet 50 is able to suppress the generation of static electricity when the adhesive sheet 50 is separated from the semiconductor device.

There is not particular restriction on the antistatic agent. Suitable antistatic agents are surface-active agents including acrylic ampholytic surface-active agents, acrylic cationic surface-active agents, and maleic anhydride anionic surface-active agents. Commercially available materials for forming an antistatic layer are, for example, Bondip PA®, Bondip PX®, and Bondip P® (Konishi). A generally used conductive filler may be used. Suitable conductive fillers are metals including Ni, Fe, Cr, Co, Al, Sb, Mo, Cu, Ag, Pt and Au, alloys of those metals, oxides of those metals, and carbon, such as carbon black. These conductive fillers may be individually used or may be used in a mixture of some of those. The conductive filler may be either powder or fibers. The adhesive sheet may contain various generally known additives, such as an antioxidant, a pigment, a plasticizer, a filler and a tackifier.

The semiconductor device fabricating method of the present invention will be described in terms of concrete examples.

EXAMPLE 1

Adhesive Sheet

An adhesive solution was prepared by dissolving 100 parts by weight of bisphenol A epoxy resin (Ebicoat 1002, Japan Epoxy Resin), 35 parts by weight of acrylonitrile-butadiene copolymer (Nippol 1072J, Nippon Zeon), 4 parts by weight of phenolic resin (P-180, Arakawa Kagaku) and 2 parts by weight of imidazole (C11Z, Shikoku Fain) in 350 parts by weight of methyl ethyl ketone. The adhesive solution was applied to a 100 μm thick copper alloy foil having one roughened surface (BHY-13B-7025, Japan Energy), and the copper alloy foil coated with the adhesive solution was dried at 150° C. for 3 min to obtain an adhesive sheet 50 having a base sheet 51 and a 15 μm thick adhesive layer 52. The adhesive layer 52 of the adhesive sheet 50 had an elastic coefficient of $2.5 \times 10^{-3}$ Pa at 100° C. before hardening, and an elastic coefficient of 4.3 MPa at 200° C. after hardening. Measured adhesive strength between the adhesive layer 52 and a test copper foil was 12 N/20 mm. The elastic coefficient at 200° C. of the copper alloy foil, i.e., the base sheet, was 130 GPa.

Conductive Pads

Dry resist films (Ohdiru AR 330, Tokyo Ohka) were laminated to both the surfaces of a 40 μm thick copper foil (Olin 7025). The dry resist films were patterned by photolithography in a pattern complementary to a pattern in which conductive parts are to be formed. A nickel layer and an Au layer were deposited in that order by plating on each of both the surfaces of the copper foil using the patterned dry resist films as masks, and then the dry resist films were removed. Then, the copper foil provided with laminated lands each of the nickel layer and the Au layer, was bonded with the adhesive layer 52 to the adhesive sheet 50. Then, the copper foil was etched using the Au layer as a resist to form separate conductive pads. The side surfaces of the copper foil were etched to form reduced parts 20b, and jutting parts 20a on the upper and the lower surface of each reduced part 20b. The adhesive sheet 50 was shaped by press working.

Thus, conductive parts 20 were formed on the adhesive sheet 50 in a pattern like that shown in FIGS. 6(a) and 6(b) showing the 500 mm wide adhesive sheet 50. Each of square divisions 70 was provided with sixty-four conductive pads 20. Sixteen conductive pads 20 were arranged along each of the sides of the division 70.

Semiconductor Chip Mounting

Test silicon chips 10 provided with aluminum electrodes 11 formed by evaporation and having a size of 6 mm×6 mm were bonded to chip-mounting regions, each of which corresponding to the chip-mounting region 71 in FIG. 6(b), of the adhesive layer 52 of the adhesive sheet 50 by applying a pressure of 0.3 MPa for 1 s at 175° C. to the test silicon chips 10. The assembly of the test silicon chips 10 and the adhesive sheet 50 was heated at 150° C. for 1 hr to cure the adhesive layer 52. The electrodes 11 of each of the silicon chips 10 were electrically connected to the conductive pads 20 with sixty-four 25 μm diameter gold wires by wire bonding.

The number of the test silicon chips 10 was 160. The 160 test silicon chips 10 were divided into ten groups each of the sixteen test silicon chips (4×4 test silicon chips). The bond success ratio was 100%. The test silicon chips and the adhesive sheet 50 were sealed in a sealing resin block 40 by transfer molding (HC-100, Nitto Denko). Then, the adhesive sheet 50 was removed at a room temperature. The sealing resin block 40 was heated at 175° C. for 5 hr in a dryer for postcuring. Then, the sealing resin block 40 was cut by a dicing machine to divide the assembly of the test silicon chips 10, the gold wires and the conductive pads 20 into individual semiconductor devices respectively formed in the divisions 70.

The interior of the semiconductor devices was observed by using a soft x-ray inspection apparatus (Microfocus x-ray television silhouette apparatus SMX-100, Shimazu Seisakusho). The observation proved that wires were not deformed and the chips were not dislocated, the jutting parts of the conductive pads were embedded in the sealing resin, and the conductive pads were firmly bonded to the sealing resin.

Wire-bonding Conditions
Apparatus: UTC-300BI SUPER, Shinkawa
Ultrasonic frequency: 115 kHz
Ultrasonic output time: 15 ms
Ultrasonic power: 120 mW
Bonding load: 1018 N
Searching load: 1037 N
Transfer Molding Conditions
Apparatus: TOWA molding machine
Molding temperature: 175° C.
Time: 90 s
Clamping pressure: 200 kN
Transfer speed: 3 mm/s
Transfer pressure: 5 kN
Elastic Coefficient Measurement
(Base Sheet and Adhesive Layer)
Apparatus: Viscoelastic spectrometer ARES (Reometorikkusu)
Heating rate: 5° C./min
Frequency: 1 Hz
Measuring mode: Tensile mode
Adhesive Strength Measurement A 35 μm thick test copper foil (C7025, Japan Energy) was bonded to an adhesive sheet 50 of 20 mm in width and 50 mm in length under bonding conditions: 120° C., 0.5 MPa and 0.5 m/min. The combination of the adhesive sheet 50 and the copper foil was heated at 150° C. for 1 hr in a hot-air oven. The copper foil laminated to the adhesive sheet 50 was pulled in a pulling direction of 180° at a pulling rate of 300 mm/min in an atmosphere of 23° C. and 65% RH. The test copper foil was assumed to be the conductive pad.

Bond Success Ratio

The pull strength of bonds formed by wire bonding was measured by using Bonding tester PTR-30 (Resuka). Measuring conditions were: measuring mode: wire-pull test, and pull speed: 0.5 mm/s. Bonds having a pull strength not lower than 0.04 N were judged to be good bonds and those having a pull strength below 0.04 N were judged to be faulty bonds. The bond success ratio is the ratio of the number of good bonds to that of tested bonds.

EXAMPLE 2

Example 2 fabricated semiconductor devices. Example 2 was similar to Example 1, except that Example 2 used a 18 μm thick Cu—Ni alloy foil (C7025, Japan Energy). The Bond success ratio was 100%. The observation of the interior of the semiconductor devices proved that wires were not deformed and the chips were not dislocated, the conductive pads were firmly bonded to the sealing resin.

Although the preferred embodiments of the present invention have been described, various changes may be made therein and the present invention is not limited thereto. It goes without saying that the present invention can be embodied in other semiconductor devices and other semiconductor device fabricating methods without departing from the scope thereof.

The semiconductor device fabricating method is capable of fabricating leadless, very thin semiconductor device not provided with any leadframe and not including any part under the semiconductor chip. The semiconductor device fabricating method of the present invention is capable of fabricating a strong semiconductor device having a semiconductor chip held in place, and conductive pads firmly bonded to a sealing resin block at a low cost.

What is claimed is:

1. A semiconductor device fabricating method comprising the steps of:
   preparing an adhesive sheet having a base sheet and an adhesive layer;
   forming a plurality of conductive pads on the adhesive layer of the adhesive sheet;
   placing semiconductor chips on the adhesive layer of the adhesive sheet and connecting the conductive pads to the semiconductor chips with wires;
   sealing the semiconductor chips, the conductive pads and the wires in a sealing resin molding on the adhesive sheet;

separating the adhesive sheet from the sealing resin molding; and cutting the sealing resin molding into packages respectively including the semiconductor chips;

wherein the step of forming the conductive pads on the adhesive layer includes the steps of: forming a plated nickel layer and a plated noble metal layer in layers at least on one of the surfaces of a metal foil, placing the metal foil provided with the plated nickel layer and the plated noble metal layer on the adhesive layer of the adhesive sheet, and etching the metal foil by using the plated nickel layer and the plated noble metal layer as a resist to form the conductive pads, each having a reduced part of the metal foil having a small size, and a jutting part of the plated nickel layer and the plated noble metal layer and jutting out from the reduced part.

2. The semiconductor device fabricating method according to claim 1, wherein in the step of forming the conductive pads, each conductive pad is formed so as to have a reduced part of the metal foil having a small size and a pair of jutting parts of the plated nickel layer and the plated noble metal layer and formed on the opposite sides of the reduced part, by forming the plated nickel layer and the plated noble metal layer on each of both the surfaces of the metal foil.

3. The semiconductor device fabricating method according to claim 1, wherein the step of forming the conductive pads further includes a step of shaping the adhesive sheet by press working after forming the conductive pads by etching the metal foil.

4. The semiconductor device fabricating method according to claim 1, wherein the metal foil is formed of copper or a copper alloy and has a thickness in the range of 0.01 to 0.1 mm.

5. The semiconductor device fabricating method according to claim 1, wherein the plated noble metal layer contains at least Au, Ag or Pd.

6. The semiconductor device fabricating method according to claim 1, wherein the base sheet of the adhesive sheet has an elastic coefficient of 1.0 GPa or above at 200° C., and the adhesive layer has an elastic coefficient of 0.1 MPa or above at 200° C.

7. The semiconductor device fabricating method according to claim 1, wherein the adhesive layer of the adhesive sheet is formed of a thermosetting adhesive, has an elastic coefficient of 0.1 MPa or below at temperatures in the range of 100° C. to 150° C. before hardening, and an elastic coefficient of 0.1 MPa or above at 200° C. after hardening.

8. The semiconductor device fabricating method according to claim 7, wherein the thermosetting adhesive contains, as essential components, an epoxy resin, an epoxy curing agent and an elastic material.

9. The semiconductor device fabricating method according to claim 1, wherein adhesive strength bonding the conductive pads and the adhesive layer of the adhesive sheet together is in the range of 0.1 to 15 N/20 mm.

* * * * *